US012620561B2

(12) United States Patent (10) Patent No.: US 12,620,561 B2

Matsuki et al. (45) Date of Patent: May 5, 2026

(54) PLASMA PROCESSING APPARATUS AND PLASMA PROCESSING METHOD

(71) Applicant: Tokyo Electron Limited, Tokyo (JP)

(72) Inventors: Nobuo Matsuki, Yamanashi (JP); Hiroyuki Matsuura, Iwate (JP); Taro Ikeda, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 421 days.

(21) Appl. No.: 18/217,885

(22) Filed: Jul. 3, 2023

(65) Prior Publication Data

US 2024/0014013 A1    Jan. 11, 2024

(30) Foreign Application Priority Data

Jul. 6, 2022    (JP) ................................. 2022-109299

(51) Int. Cl.
    *H01J 37/32*        (2006.01)
    *H10P 14/40*        (2026.01)

(52) U.S. Cl.
    CPC .. *H01J 37/32568* (2013.01); *H01J 37/32082* (2013.01); *H01J 37/3244* (2013.01); *H01J 37/32715* (2013.01); *H01J 2237/201* (2013.01); *H01J 2237/332* (2013.01); *H10P 14/412* (2026.01)

(58) Field of Classification Search
    CPC ........... H01J 37/32082; H01J 37/32541; H01J 37/3244; H01J 37/32715; H01J 37/32568
    See application file for complete search history.

(56) References Cited

U.S. PATENT DOCUMENTS

2015/0107517 A1*    4/2015  Hasebe ................. C23C 16/452
                                                          118/723 R
2019/0085456 A1*    3/2019  Jo ........................ H01J 37/3244

FOREIGN PATENT DOCUMENTS

JP          2004-343017 A      12/2004

* cited by examiner

*Primary Examiner* — Joseph A Miller, Jr.
(74) *Attorney, Agent, or Firm* — Venjuris, P.C.

(57) ABSTRACT

A plasma processing apparatus includes a processing container having an opening in a sidewall, a partition wall that covers the opening and defines an internal space communicating with an inside of the processing container, and an internal electrode that passes through the partition wall, is airtightly inserted into the internal space, and is supplied with RF power. A first gap is provided between the partition wall and the internal electrode.

11 Claims, 6 Drawing Sheets

PLASMA PROCESSING APPARATUS AND PLASMA PROCESSING METHOD

CROSS-REFERENCE TO RELATED APPLICATIONS

The present application is based on and claims priority from Japanese Patent Application No. 2022-109299, filed on Jul. 6, 2022, with the Japan Patent Office, the disclosure of which is incorporated herein in its entirety by reference.

TECHNICAL FIELD

The present disclosure relates to a plasma processing apparatus and a plasma processing method.

BACKGROUND

A technique is known in which a vertical type plasma processing apparatus is provided with a plasma partition wall so as to cover an opening formed in a sidewall of a processing container, and plasma is generated in an internal space covered with the plasma partition wall (see, e.g., Japanese Patent Laid-Open Publication No. 2004-343017).

SUMMARY

A plasma processing apparatus according to an aspect of the present disclosure includes a processing container having an opening in a sidewall, a partition wall that covers the opening and defines an internal space communicating with an inside of the processing container, and an internal electrode that passes through the partition wall, is airtightly inserted into the internal space, and supplied with RF power. A first gap is provided between the partition wall and the internal electrode.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
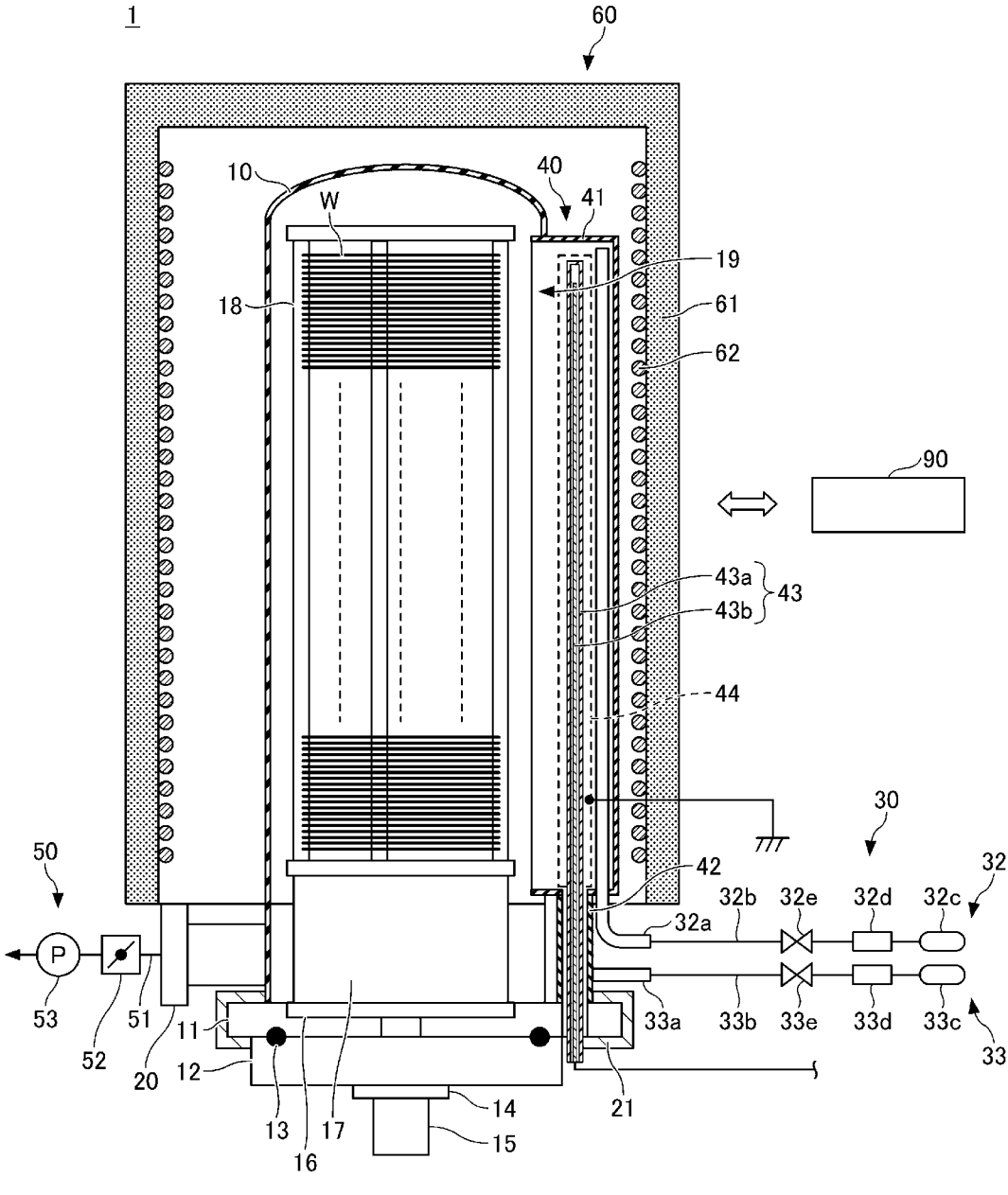
FIG. 1 is a schematic view illustrating a plasma processing apparatus according to an embodiment.
Figure 2:
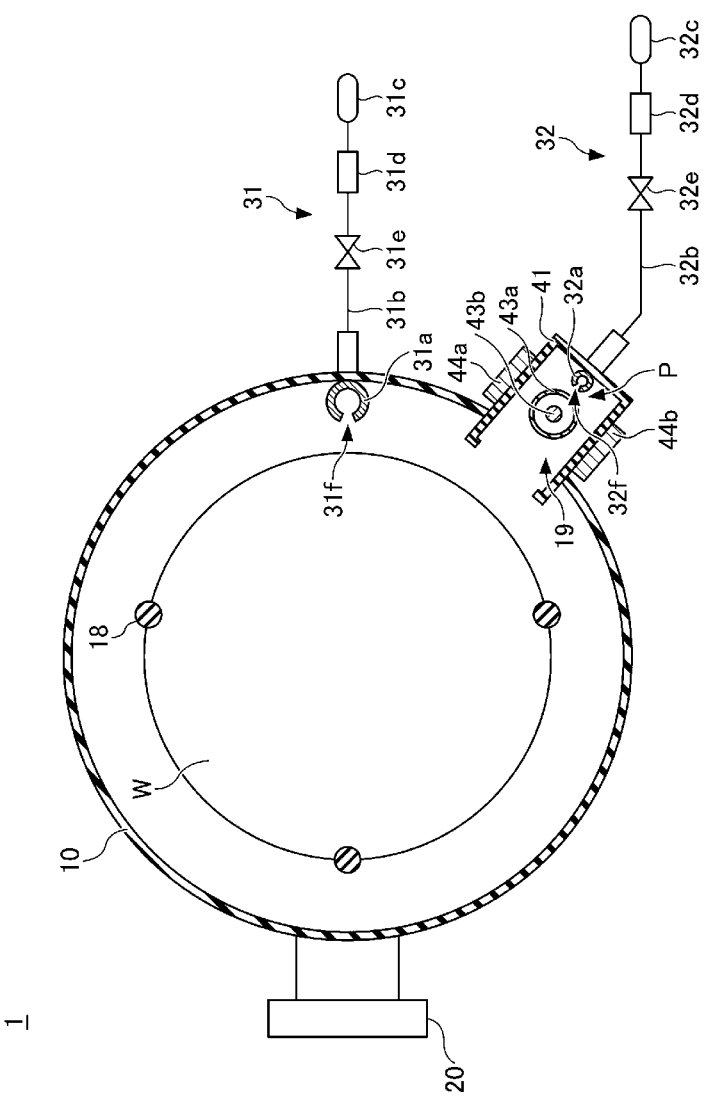
FIG. 2 is a horizontal cross-sectional view illustrating the plasma processing apparatus according to the embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions thereof will be omitted.

[Plasma Processing Apparatus]

A plasma processing apparatus 1 according to an embodiment will be described with reference to FIGS. 1 to 4. The plasma processing apparatus 1 is a batch type apparatus that processes a plurality of (e.g., 50 to 200) substrates W at once. The substrates W are, for example, semiconductor wafers such as silicon wafers. The plasma processing apparatus 1 includes a reactor 10, a gas supply 30, a plasma generator 40, an exhauster 50, a heater 60, and a controller 90.

The reactor 10 has a cylindrical shape with an open lower end and a ceiling. The inside of the reactor 10 may be depressurized. The reactor 10 functions as a processing container that accommodates therein the plurality of substrates W arranged in multiple tiers. The reactor 10 is made of, for example, quartz.

Figure 3:
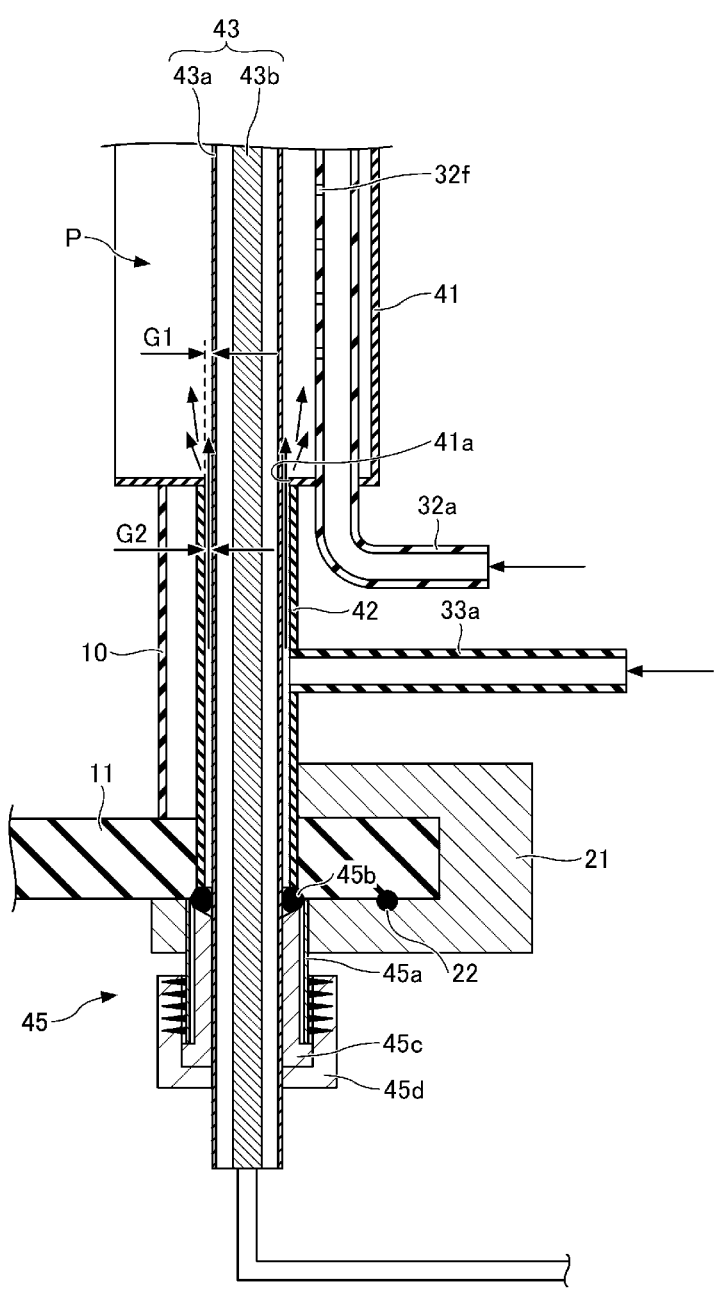
FIG. 3 is a cross-sectional view illustrating an example of a plasma generator.
Figure 4:
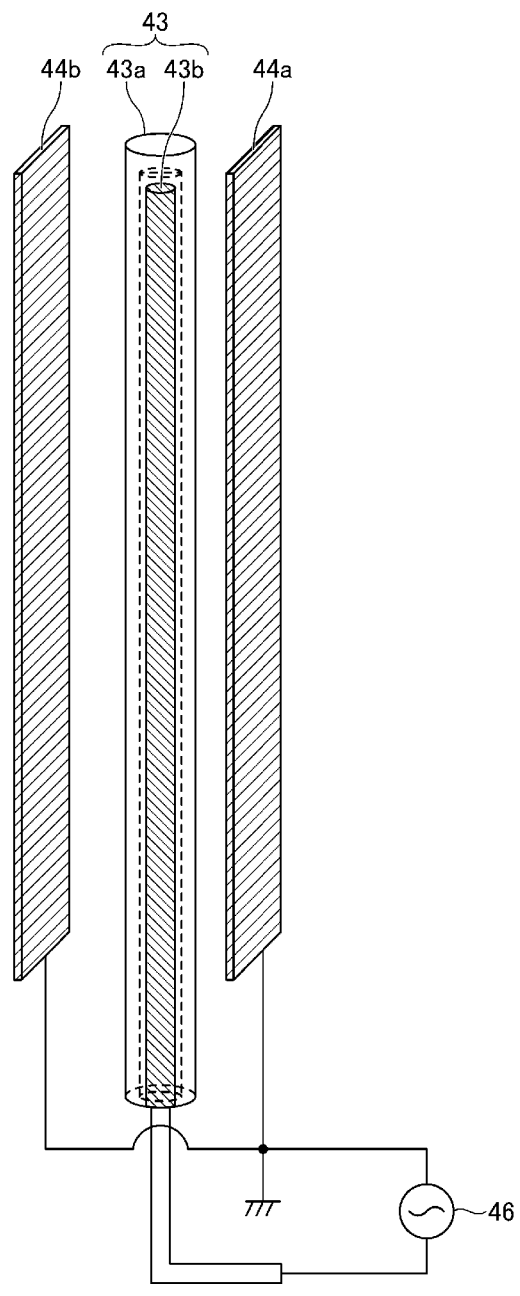
FIG. 4 is a schematic view illustrating an example of an internal electrode and an external electrode.

A bottom flange 11 is formed at the lower end of the reactor 10. The bottom flange 11 is supported by a metal flange 21. The metal flange 21 is provided so as to sandwich an outer edge of the bottom flange 11 therebetween via a sealing member 22 such as an O-ring (FIG. 3). The metal flange 21 is made of, for example, stainless steel. A lid 12 is airtightly attached to a lower surface of the bottom flange 11 via a sealing member 13 such as an O-ring. Thus, an opening at the lower end of the reactor 10 is airtightly closed. The lid 12 is made of, for example, stainless steel. A rotary shaft 15 is provided through a central portion of the lid 12 via a magnetic fluid seal 14. The rotary shaft 15 is rotatable relative to the lid 12. The lid 12 and the rotary shaft 15 may move up and down relative to the reactor 10. A turntable 16 is provided at an upper end of the rotary shaft 15. A boat 18 is placed on the turntable 16 with a heat insulating cylinder 17 interposed therebetween. The heat insulating cylinder 17 and the boat 18 are made of, for example, quartz. The heat insulating cylinder 17 prevents heat radiation from the opening at the lower end of the reactor 10. The boat 18 may move up and down in conjunction with the lid 12. The boat 18 is rotatable in conjunction with the rotary shaft 15. The boat 18 holds the plurality of substrates W arranged in multiple stages in the vertical direction.

A sidewall of the reactor 10 is provided with a rectangular opening 19 in the longitudinal direction (vertical direction) thereof. A length of the opening 19 in the vertical direction is the same as or longer than a length of the boat 18, so that the boat 18 and the opening 19 are formed so as to extend in the vertical direction, respectively. The opening 19 is covered with a partition wall 41 to be described later. The partition wall 41 defines an internal space P. The internal space P communicates with the inside of the reactor 10 through the opening 19.

An exhaust port 20 is provided at a lower portion of the sidewall of the reactor 10. The inside of the reactor 10 is emptied through the exhaust port 20 by the exhauster 50 to be described later.

The gas supply 30 includes a raw material gas supply 31, a reaction gas supply 32, and a purge gas supply 33.

The raw material gas supply 31 includes a raw material gas supply pipe 31a inserted into the reactor 10 and has a raw material gas supply path 31b outside the reactor 10. The raw material gas supply path 31*b* is provided with a raw material gas source 31*c*, a mass flow controller 31*d*, and a valve 31*e* in this order from upstream to downstream in a gas flow direction. Thus, the supply timing of a raw material gas from the raw material gas source 31*c* is controlled by the valve 31*e*, and the raw material gas is adjusted to a predetermined flow rate by the mass flow controller 31*d*. The raw material gas is introduced into the raw material gas supply pipe 31*a* from the raw material gas supply path 31*b* and is discharged into the reactor 10 from the raw material gas supply pipe 31*a*. The raw material gas may be, for example, a metal-containing gas or a silicon-containing gas. Examples of the metal-containing gas may include titanium tetrachloride (TiCl$_4$) gas. Examples of the silicon-containing gas may include dichlorosilane (DCS) gas.

The reaction gas supply 32 includes a reaction gas supply pipe 32*a* inserted into the internal space P and has a reaction gas supply path 32*b* outside the reactor 10. The reaction gas supply path 32*b* is provided with a reaction gas source 32*c*, a mass flow controller 32*d*, and a valve 32*e* in this order from upstream to downstream in the gas flow direction. Thus, the supply timing of a reaction gas from the reaction gas source 32*c* is controlled by the valve 32*e*, and the reaction gas is adjusted to a predetermined flow rate by the mass flow controller 32*d*. The reaction gas is introduced into the reaction gas supply pipe 32*a* from the reaction gas supply path 32*b* and is discharged into the internal space P from the reaction gas supply pipe 32*a*. The reaction gas is a gas that reacts with the raw material gas to produce a reaction product, and may be, for example, a nitriding gas. Examples of the nitriding gas may include ammonia (NH$_3$) gas.

The purge gas supply 33 includes a purge gas supply pipe 33*a* connected to an introduction pipe 42 to be described later and has a purge gas supply path 33*b* outside the reactor 10. The purge gas supply path 33*b* is provided with a purge gas source 33*c*, a mass flow controller 33*d*, and a valve 33*e* in this order from upstream to downstream in the gas flow direction. Thus, the supply timing of a purge gas from the purge gas source 33*c* is controlled by the valve 33*e*, and the purge gas is adjusted to a predetermined flow rate by the mass flow controller 33*d*. The purge gas is introduced into the purge gas supply pipe 33*a* from the purge gas supply path 33*b* and is discharged into the introduction pipe 42 from the purge gas supply pipe 33*a*. The purge gas discharged into the introduction pipe 42 functions as a counterflow against the raw material gas and the reaction gas, which are introduced into the introduction pipe 42 from the internal space P. Therefore, inflow of the raw material gas and the reaction gas into the introduction pipe 42 is prevented. The flow rate of the purge gas may be, for example, 100 sccm or more. In this case, it is easy to prevent the inflow of the raw material gas and the reaction gas into the introduction pipe 42. The ratio of the flow rate of the purge gas to the flow rate of the reaction gas discharged from the reaction gas supply pipe 32*a* may be particularly 20% or less, and more particularly, may be 10% or less. Examples of the purge gas may include an inert gas such as nitrogen (N$_2$) gas or argon (Ar) gas.

Each gas supply pipe (raw material gas supply pipe 31*a*, reaction gas supply pipe 32*a*, or purge gas supply pipe 33*a*) is made of, for example, quartz. The raw material gas supply pipe 31*a* extends linearly in the vertical direction near an inner surface of the reactor 10, is bent in an L-shape at a lower portion of the reactor 10, passes through a side surface of the reactor 10, and extends to the outside of the reactor 10. The reaction gas supply pipe 32*a* extends linearly in the vertical direction near an inner surface of the partition wall 41, passes through a bottom surface of the partition wall 41, and extends to the outside of the reactor 10. The purge gas supply pipe 33*a* extends linearly in the horizontal direction outside the reactor 10 and is connected to a pipe wall of the introduction pipe 42.

A plurality of raw material gas outlets 31*f* are provided at a portion of the raw material gas supply pipe 31*a* located inside the reactor 10. A plurality of reaction gas outlets 32*f* are provided at a portion of the reaction gas supply pipe 32*a* located in the internal space P. Each outlet (raw material gas outlet 31*f* or reaction gas outlet 32*f*) is formed at a predetermined interval in a direction in which each gas supply pipe extends. Each outlet discharges the gas in the horizontal direction. The interval between the respective outlets is set to be equal to, for example, the interval between the substrates W held in the boat 18. The position of each outlet in the height direction is set to an intermediate position between the substrates W adjacent to each other in the vertical direction. Thus, each outlet may efficiently supply the gas to opposite surfaces between the adjacent substrates W.

The gas supply 30 may blend a plurality of types of gases and discharge a blend of the gases from one supply pipe. For example, the raw material gas supply pipe 31*a* may be configured to be capable of discharging an inert gas to the inside of the reactor 10. For example, the reaction gas supply pipe 32*a* may be configured to be capable of discharging an inert gas into the internal space P. The gas supply 30 may further include a supply pipe for supplying another gas in addition to the raw material gas supply pipe 31*a*, the reaction gas supply pipe 32*a*, and the purge gas supply pipe 33*a*.

The plasma generator 40 includes the partition wall 41, the introduction pipe 42, an internal electrode 43, an external electrode 44, a seal unit 45, and an RF power supply 46.

The partition wall 41 is provided at apart of the sidewall of the reactor 10. The partition wall 41 extends in a direction in which the plurality of substrates W are arranged. The partition wall 41 is airtightly welded to the sidewall of the reactor 10. The partition wall 41 has a concave shape in horizontal cross section. The partition wall 41 covers the opening 19 and defines the internal space P communicating with the inside of the reactor 10. The reaction gas supply pipe 32*a* is provided in the internal space P. The partition wall 41 is made of, for example, quartz. The bottom surface of the partition wall 41 is provided with an introduction opening 41*a* into which the internal electrode 43 is inserted.

The introduction pipe 42 is airtightly welded to the bottom surface of the partition wall 41. The introduction pipe 42 is made of, for example, quartz. The introduction pipe 42 has a cylindrical shape, and is configured to cover the introduction opening 41*a* and to communicate with the internal space P through the introduction opening 41*a*.

The internal electrode 43 passes through the partition wall 41 and is detachably and airtightly inserted into the internal space P. The internal electrode 43 includes an insulating tube 43*a* and a rod-shaped electrode 43*b*.

The insulating tube 43*a* has an elongated cylindrical shape with a sealed upper end. The insulating tube 43*a* passes through the partition wall to be airtightly inserted into the internal space P, and extends in the direction in which the plurality of substrates W are arranged. A material of the insulating tube 43*a* may be, for example, ceramics such as alumina, or quartz. The material of the insulating tube 43*a* may be particularly quartz from the viewpoint of preventing ion damage due to a plasma when the substrate W is plasma-processed, or corrosion by a fluorine-based gas when the inside of the reactor 10 is dry-cleaned. The atmosphere inside the insulating tube 43a may be, for example, the atmosphere or an inert gas. A pressure inside the insulating tube 43a may be, for example, the atmospheric pressure. An outer diameter of the insulating tube 43a is smaller than an inner diameter of the introduction opening 41a and an inner diameter of the introduction pipe 42. In this case, the insulating tube 43a may be inserted into the internal space P with a first gap G1 with respect to the partition wall 41 and may be inserted into the introduction pipe 42 with a second gap G2 therebetween. For example, the first gap G1 is narrower than the second gap G2. In this case, it is easy to prevent the inflow of the raw material gas and the reaction gas from the internal space P into the introduction pipe 42. The first gap G1 is, for example, 0.1 mm or more and 3.0 mm or less. In this case, the flow rate of the purge gas supplied into the introduction pipe 42 may be reduced. The first gap G1 may be particularly 0.3 mm or more and 2.0 mm or less from the viewpoint of minimizing the flow rate of the purge gas supplied into the introduction pipe 42. By reducing the flow rate of the purge gas, it is possible to prevent the effect of the purge gas on the amount of raw material gas adsorbed to each substrate W or on the state of a plasma generated in the internal space P.

The rod-shaped electrode 43b has an elongated cylindrical shape and is inserted into the insulating tube 43a. The rod-shaped electrode 43b has a lower end which is pulled out from a lower end of the insulating tube 43a into the atmosphere and is connected to the RF power supply 46 via a feeder line and matcher (which are not illustrated). RF power is supplied from the RF power supply 46 to the rod-shaped electrode 43b. Since the rod-shaped electrode 43b is provided in the internal space P, it is used at a plasma processing temperature (e.g., 400° C.) or higher. A material of the rod-shaped electrode 43b may be a metal with low resistivity, and may employ copper or iron. However, since copper or iron has a high diffusion coefficient in quartz, a nickel alloy with high heat resistance and oxidation resistance may be employed from the viewpoint of avoiding metal contamination to the inside of the reactor 10.

The external electrode 44 includes a first external electrode 44a and a second external electrode 44b. The first external electrode 44a and the second external electrode 44b each have an elongated rectangular plate shape, the longitudinal direction of which corresponds to the vertical direction. The first external electrode 44a and the second external electrode 44b are fixed to outer surfaces of sidewalls of the partition wall 41. The first external electrode 44a and the second external electrode 44b are arranged opposite to each other. In this case, when RF power is supplied to the internal electrode 43, a capacitively coupled plasma (CCP) is generated between the internal electrode 43 and the first external electrode 44a and between the internal electrode 43 and the second external electrode 44b. Therefore, the plasma may be generated in a wide range of the internal space P. However, the external electrode 44 may include only one of the first external electrode 44a and the second external electrode 44b. For example, the first external electrode 44a and the second external electrode 44b are grounded. In this case, damage caused by the plasma to an inner surface of the sidewall of the partition wall 41 may be prevented.

The seal unit 45 airtightly seals the second gap G2 at the lower end of the introduction pipe 42. The seal unit 45 includes an inner cylinder member 45a, a sealing member 45b, a sleeve 45c, and an outer cylinder member 45d.

The inner cylinder member 45a is provided through a bottom wall of the metal flange 21. The inner cylinder member 45a is integrally formed with, for example, the metal flange 21. The inner cylinder member 45a has a male threaded portion on an outer peripheral surface thereof.

The sealing member 45b is provided between the insulating tube 43a, the sleeve 45c, and the bottom flange 11. The sealing member 45b is, for example, an O-ring.

The sleeve 45c is inserted inside the inner cylinder member 45a. The sleeve 45c crushes the sealing member 45b at an upper end thereof by moving upward. Thus, the sealing member 45b is pressed against three points including the insulating tube 43a, the sleeve 45c, and the bottom flange 11, so that the second gap G2 is airtightly sealed.

The outer cylinder member 45d has, on an inner peripheral surface thereof, a female threaded portion which is screwed to the male threaded portion of the inner cylinder member 45a. The sleeve 45c moves upward by screwing the female threaded portion of the outer cylinder member 45d to the male threaded portion of the inner cylinder member 45a. The outer cylinder member 45d is, for example, a nut.

The RF power supply 46 supplies RF power to the rod-shaped electrode 43b. Thus, the plasma is generated from the reaction gas supplied to the internal space P. The RF power has a frequency of, for example, 13.56 MHz.

The exhauster 50 includes an exhaust passage 51, a pressure regulating valve 52, and a vacuum pump 53. The exhaust passage 51 is connected to the exhaust port 20. The exhauster 50 regulates the pressure inside the reactor 10 by the pressure regulating valve 52 while evacuating the inside of the reactor 10 by the vacuum pump 53.

The heater 60 is provided around the reactor 10. The heater 60 includes a cylindrical heater chamber 61 with a ceiling and a heater wire 62 spirally wound on an inner surface of the heater chamber 61. The heater 60 heats each substrate W accommodated inside the reactor 10 by heat generated by the heater wire 62.

The controller 90 performs a plasma processing method to be described later, for example, by controlling the operation of each part of the plasma processing apparatus 1. The controller 90 may be, for example, a computer. A computer program that performs the operation of each part of the plasma processing apparatus 1 is stored in a storage medium. The storage medium may be, for example, a flexible disk, compact disk, hard disk, flash memory, or DVD.

A plasma processing method performed using the plasma processing apparatus 1 according to the embodiment will be described with reference to FIG. 5. The plasma processing method according to the embodiment is performed by the controller 90 controlling the operation of each part of the plasma processing apparatus 1. In the following, a case of forming a titanium nitride (TiN) film on the substrate W by plasma-enhanced atomic layer deposition (PEALD) as a plasma processing will be described by way of example. The TiN film is used as, for example, a conductive functional film such as vias, plugs, and contacts of semiconductor devices. The TiN film is used, for example, as a capacitor electrode in DRAMs, or a contact barrier metal in DRAMs, 3D NANDs, and logics.

First, the boat 18 holding the plurality of substrates W is lifted from below the reactor 10 and is loaded into the reactor 10 which is adjusted in advance to a predetermined temperature, and the opening at the lower end of the reactor 10 is closed by the lid 12, so that the inside of the reactor 10 is sealed. Subsequently, the inside of the reactor 10 is evacuated by the exhauster 50 to remain at a process pressure, and the substrate is raised in temperature by the heater 60 to remain at a process temperature. The boat 18 is rotated by rotation of the rotary shaft 15.

Figure 5:
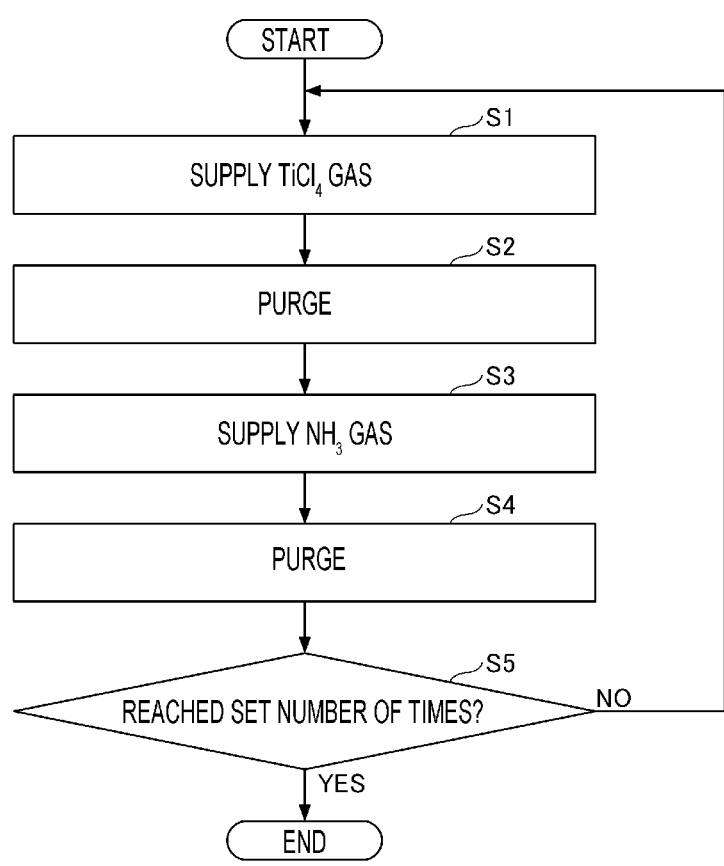
FIG. 5 is a flowchart illustrating a plasma processing method according to the embodiment.

Next, the controller 90 performs steps S1 to S5 illustrated in FIG. 5 to form a TiN film on each substrate W.

In step S1, $TiCl_4$ gas is supplied to the inside of the reactor 10 from the raw material gas supply 31, so that the $TiCl_4$ gas is adsorbed onto each substrate W. In step S1, an inert gas may be supplied from the reaction gas supply 32 to the internal space P. In this case, the $TiCl_4$ gas supplied to the inside of the reactor 10 may be prevented from entering the internal space P.

Step S2 is performed after step S1. In step S2, while the inside of the reactor 10 is evacuated by the exhauster 50, an inert gas is supplied from the raw material gas supply 31 to the inside of the reactor 10, and an inert gas is supplied from the reaction gas supply 32 to the internal space P. Thus, the $TiCl_4$ gas remaining inside the reactor 10 and in the internal space P is discharged. In step S2, evacuation of the inside of the reactor 10 by the exhauster 50, the supply of the inert gas from the raw material gas supply 31 to the inside of the reactor 10, and the supply of the inert gas from the reaction gas supply 32 to the internal space P may be performed alternately. In step S2, the inert gas may be supplied from only one of the raw material gas supply 31 and the reaction gas supply 32.

Step S3 is performed after step S2. In step S3, $NH_3$ gas is supplied from the reaction gas supply 32 to the internal space P, and RF power is applied from the RF power supply 46a to the internal electrode 43, so that a plasma is generated from the $NH_3$ gas in the internal space P. Active species contained in the generated plasma diffuse from the internal space P to the inside of the reactor 10, and the $TiCl_4$ gas adsorbed onto each substrate W is nitrified to form a TiN film. In step S3, an inert gas may be supplied from the raw material gas supply 31 to the inside of the reactor 10. In this case, entry of active species into the raw material gas supply pipe 31a may be prevented. Therefore, it is possible to prevent the deposition of the TiN film inside the raw material gas supply pipe 31a.

Step S4 is performed after step S3. In step S4, while the inside of the reactor 10 is evacuated by the exhauster 50, an inert gas is supplied from the raw material gas supply 31 to the inside of the reactor 10, and an inert gas is supplied from the reaction gas supply 32 to the internal space P. Thus, the $NH_3$ gas remaining inside the reactor 10 and in the internal space P is discharged. In step S4, evacuation of the inside of the reactor 10 by the exhauster 50, the supply of the inert gas from the raw material gas supply 31 to the inside of the reactor 10, and the supply of the inert gas from the reaction gas supply 32 to the internal space P may be performed alternately. In step S4, the inert gas may be supplied from only one of the raw material gas supply 31 and the reaction gas supply 32.

Step S5 is performed after step S4. In step S5, it is determined whether or not steps S1 to S4 have been performed a set number of times. When the number of implementation times has not reached the set number of times (NO in step S5), steps S1 to S4 are performed again. Meanwhile, when the number of implementation times has reached the set number of times (YES in step S5), the film thickness of the TiN film has reached a target film thickness, so that the processing ends. In this way, a TiN film is formed on each substrate W by repeating steps S1 to S4 until the number of implementation times reaches the set number of times. The set number of times in step S5 is set according to, for example, the target film thickness of the TiN film. The set number of times in step S5 may be one time or a plurality of times.

As described above, according to the plasma processing apparatus 1 of the embodiment, the internal electrode 43, which passes through the partition wall 41 and is airtightly inserted into the internal space P and to which RF power is supplied, is provided, and the first gap G1 is provided between the partition wall 41 and the internal electrode 43. In this case, even when a conductive film is deposited on the inner surface of the partition wall 41 or the outer surface of the internal electrode 43 by the plasma generated in the internal space P, the internal electrode 43 and the partition wall 41 are not electrically connected. Therefore, discharge may be maintained in the internal space P. As a result, in a batch type apparatus, a conductive film may be formed on the plurality of substrates W at once by PEALD.

For example, when forming a TiN film by PEALD, it is possible to shorten the time required to form the TiN film having a film quality equivalent to that of a TiN film formed by thermal ALD, or to lower a film formation temperature. Further, by forming the TiN film by PEALD at the same temperature as the film formation temperature when forming the TiN film by thermal ALD, a TiN film with a lower resistivity may be formed.

For example, when the resistivity of the TiN film is 100 $\mu\Omega$cm, a skin depth for 13.56 MHz is 137 $\mu$m. Therefore, when a plasma processing is performed in a range where the TiN film deposited on the surface of the internal electrode 43 is sufficiently smaller than the skin depth, the RF power supplied to the internal electrode 43 is hardly attenuated by the TiN film, so that a stable plasma may be generated in the internal space P.

Meanwhile, consider a case where a pair of electrodes (hereinafter referred to as "parallel plate electrodes") are arranged opposite to each other on outer surfaces of two sidewalls of the partition wall 41 defining the internal space P, and RF power is supplied between the parallel plate electrodes to generate a plasma in the internal space P. In this case, when a conductive film is deposited on inner surfaces of the sidewalls of the partition wall 41 and a film thickness of the deposited conductive film exceeds a certain film thickness, the conductivity of the conductive film becomes closer to the conductivity of the plasma generated in the internal space P. Therefore, the RF power supplied to the parallel plate electrodes is mainly consumed by the current flowing through the conductive film. Then, the RF power for generating the plasma in the internal space P becomes insufficient, and discharge of the plasma in the internal space P becomes difficult before the conductive film formed on the substrate W reaches a target film thickness. That is, it becomes difficult to generate the plasma in the internal space P while the conductive film is being formed on the substrate W.

Specifically, for example, the plasma density in a case where RF power, which has a frequency of 13.56 MHz and an output of 200 W, is supplied between the parallel plate electrodes and a plasma is generated from an argon gas at 500° C. in the internal space P is assumed to be $1 \times 10^{16}/m^3$. The resistance value of this plasma is calculated to be 1.9$\Omega$ at 66.5 Pa. On the other hand, it is assumed that, for example, when a TiN film having a film thickness of 10 nm is formed on each substrate W by PEALD, a TiN film having the same film thickness is also deposited on the inner surfaces of the sidewalls of the partition wall 41. Assuming that the resistivity of the TiN film having the film thickness of 10 nm is 100 $\mu\Omega$cm, the resistance value of the TiN film deposited on the inner surfaces of the sidewalls of the partition wall 41, which short-circuits the parallel plate electrodes at the shortest distance, is about 2.5$\Omega$, which is 9
10 close to the resistance value of plasma. It is assumed that the resistance value of plasma generated from an ammonia gas is also close to the resistance value of plasma generated from the argon gas. In this case, the RF power supplied between the parallel plate electrodes is mainly consumed by the current flowing through the TiN film deposited on the inner surfaces of the sidewalls of the partition wall 41, making the discharge of plasma in the internal space P difficult.

[Modification of Plasma Processing Apparatus]

Figure 6:
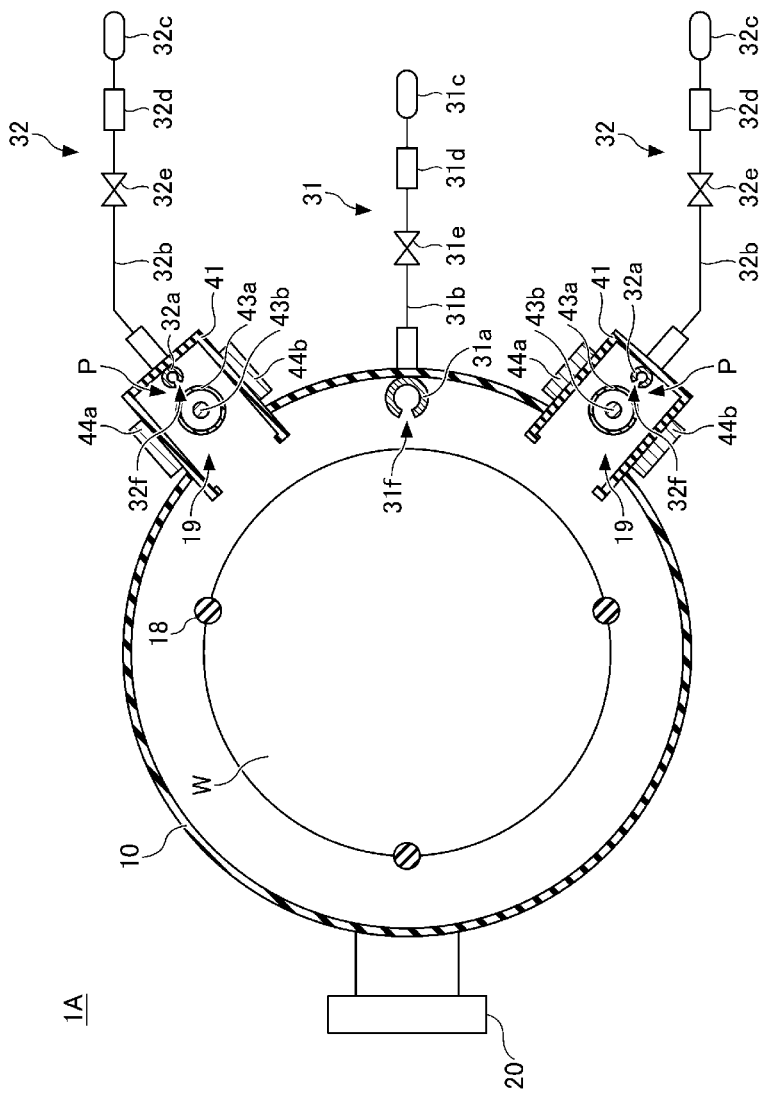
FIG. 6 is a horizontal cross-sectional view illustrating a plasma processing apparatus according to a modification of the embodiment.

A plasma processing apparatus 1A according to a modification of the embodiment will be described with reference to FIG. 6. The plasma processing apparatus 1A illustrated in FIG. 6 differs from the plasma processing apparatus 1 in that there are two internal spaces P in which a plasma is generated. Other configurations may be the same as those of the plasma processing apparatus 1. Hereinafter, differences from the plasma processing apparatus 1 will be mainly described.

The two internal spaces P are formed respectively by the partition wall 41. Two partition walls 41 are provided at different positions in the circumferential direction of the reactor 10. For example, the two partition walls 41 are provided so as to sandwich the raw material gas supply pipe 31a in the circumferential direction of the reactor 10.

The same effects as in the plasma processing apparatus 1 may also be obtained in the plasma processing apparatus 1A. Three or more internal spaces P may be provided.

According to the present disclosure, discharge may be maintained even when a film is deposited on a partition wall.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing container having an opening in a sidewall;
   a partition wall configured to cover the opening and define an internal space communicating with an inside of the processing container;
   an internal electrode that passes through the partition wall, is airtightly inserted into the internal space, and is supplied with RF power; and
   an external electrode provided outside the partition wall, the external electrode being grounded,
   wherein a first gap is provided between the partition wall and the internal electrode.

2. The plasma processing apparatus according to claim 1, wherein the partition wall has an introduction opening into which the internal electrode is inserted,
   the plasma processing apparatus further comprises an introduction pipe having a cylindrical shape that is fixed to the partition wall and communicates internally with the introduction opening, and
   the internal electrode is inserted into the introduction pipe with a second gap therebetween.

3. The plasma processing apparatus according to claim 2, wherein the introduction pipe is connected to a gas supply pipe that supplies a purge gas to the second gap.

4. The plasma processing apparatus according to claim 2, wherein the first gap is narrower than the second gap.

5. The plasma processing apparatus according to claim 2, wherein the second gap is airtightly sealed at a lower end of the introduction pipe.

6. The plasma processing apparatus according to claim 1, wherein the internal electrode includes an insulating tube having a cylindrical shape and a rod-shaped electrode inserted into the insulating tube.

7. The plasma processing apparatus according to claim 1, wherein the external electrode is provided on each of two opposite side surfaces of the partition wall.

8. The plasma processing apparatus according to claim 1, further comprising:
   a raw material gas supply configured to supply a raw material gas to the inside of the processing container; and
   a reaction gas supply configured to supply a reaction gas that reacts with the raw material gas, into the internal space.

9. The plasma processing apparatus according to claim 1, wherein the processing container is configured to accommodate a plurality of substrates arranged in multiple tiers, and
   the partition wall and the internal electrode extend in a direction in which the plurality of substrates are arranged.

10. A plasma processing method comprising:
   providing a plasma processing apparatus including:
      a processing container having an opening in a sidewall;
      a partition wall configured to cover the opening and define an internal space communicating with an inside of the processing container;
      an internal electrode that passes through the partition wall, is airtightly inserted into the internal space, and is supplied with RF power, a first gap being provided between the partition wall and the internal electrode; and
      an external electrode provided outside the partition wall, the external electrode being grounded,
   performing a plasma processing on a substrate accommodated in the processing container,
   wherein the plasma processing includes generating plasma from a gas supplied to the internal space by applying the RF power to the internal electrode.

11. The plasma processing method according to claim 10, wherein the plasma processing includes forming a conductive film on the substrate.

* * * * *